(12) United States Patent
Klaeui et al.

(10) Patent No.: US 12,345,781 B2
(45) Date of Patent: Jul. 1, 2025

(54) APPARATUS AND METHOD FOR GENERATING MAGNETIC VORTEX SPIN STRUCTURES

(71) Applicant: Infineon Technologies AG, Neubiberg (DE)

(72) Inventors: Mathias Klaeui, Mainz (DE); Udo Ausserlechner, Villach (AT); Johannes Guettinger, Lind Ob Velden (AT); Armin Satz, Villach (AT); Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 216 days.

(21) Appl. No.: 17/864,810

(22) Filed: Jul. 14, 2022

(65) Prior Publication Data

US 2023/0026375 A1    Jan. 26, 2023

(30) Foreign Application Priority Data

Jul. 21, 2021    (DE) .......................... 102021118833.4

(51) Int. Cl.
  *G01R 33/07*    (2006.01)
  *G01R 33/09*    (2006.01)
  *H01F 10/32*    (2006.01)

(52) U.S. Cl.
  CPC ............. *G01R 33/07* (2013.01); *G01R 33/09* (2013.01); *H01F 10/32* (2013.01)

(58) Field of Classification Search
  CPC ................................ G01R 33/07; G01R 33/09
  See application file for complete search history.

(56) References Cited

U.S. PATENT DOCUMENTS

| | | | | |
|---|---|---|---|---|
| 7,697,243 B1 * | 4/2010 | Novosad | ................ | B82Y 25/00 360/110 |
| 2016/0314827 A1 * | 10/2016 | Cros | ....................... | G11C 11/16 |
| 2019/0296765 A1 | 9/2019 | Pinna et al. | | |

FOREIGN PATENT DOCUMENTS

DE    102016200161 A1    7/2017

* cited by examiner

*Primary Examiner* — Alesa Allgood
(74) *Attorney, Agent, or Firm* — Harrity & Harrity, LLP (57) ABSTRACT

An apparatus for generating magnetic vortex spin structures includes a device for moving at least one magnetic domain wall in a magnetic domain wall channel structure; and a device for generating and storing at least one magnetic vortex spin structure in response to the magnetic domain wall moved in the domain wall channel structure.

24 Claims, 10 Drawing Sheets

APPARATUS AND METHOD FOR GENERATING MAGNETIC VORTEX SPIN STRUCTURES

RELATED APPLICATION

This application claims priority to Germany Patent Application No. 102021118833.4, filed on Jul. 21, 2021, which is incorporated herein by reference in its entirety.

FIELD

The present disclosure relates to apparatuses and methods for generating and storing magnetic vortex spin structures, such as magnetic skyrmions, for example, in particular for generating and storing magnetic vortex spin structures in response to rotating magnetic fields.

BACKGROUND

Multirotation sensors that can sense a plurality of revolutions are used in many areas of the automotive and automation industries. Conventional multirotational sensors have a complex architecture, a limited applicability—in particular a small number of the maximum number of detectable revolutions—and high costs.

There are three conventional approaches for sensing a plurality of revolutions:
(i) gearing-based sensors: for the purpose of sensing a plurality of revolutions, angle sensors that can sense one revolution can be combined with mechanical gearing approaches. However, the latter are only very limited in terms of the number of revolutions that can be sensed before the complexity of the gearing becomes too expensive and unreliable since its mechanical complexity reduces its longevity.
(ii) Discrete combination systems: the only solution at present for non-contact sensing of >16 revolutions is the combination of an angle sensor with an additional separate semiconductor counting element containing logic circuits and a nonvolatile memory. Typical examples are Wiegand effect sensors that can be combined with an ASIC (Application-Specific Integrated Circuit) and a nonvolatile memory, but are expensive on account of the complexity.
(iii) Magnetic spiral sensor: for counting up to 16 revolutions, a GMR-based (GMR: Giant MagnetoResistance) spiral has been developed which allows the movement of magnetic domain walls to be sensed. For this purpose, it is possible to use a magnetic GMR multilayer structure having a fixed layer, in which the magnetization is always constant, and a sensor layer, in which a domain wall (DW) can be moved by a magnetic field. One limitation of this apparatus is the number of revolutions, which is too small for a power-assisted steering system, for example, where >200 revolutions are required. Moreover, in the case of this approach, a rotating magnetic field which rotates for more than the 16 revolutions moves the DW out of the spiral, which can result in operating errors.

Therefore, there is a need for improved solutions for multirotation sensors by comparison with the conventional approaches.

SUMMARY

This need is met by apparatuses and methods as claimed in the independent claims. The dependent claims relate to advantageous developments.

In accordance with a first aspect of the present disclosure, what is proposed is an apparatus for generating magnetic vortex spin structures, such as, for example, skyrmions and related magnetic vortex structures such as skyrmionium, merons or the like. These magnetic vortex structures behave like particles or quasi-particles of finite mass. The apparatus includes a device for moving at least one magnetic domain wall (region of a solid body in which differently oriented magnetic domains or Weiss domains meet one another) in a magnetic domain wall channel structure. The apparatus furthermore includes a device for generating and storing at least one magnetic vortex spin structure in response to the magnetic domain wall moved in the domain wall channel structure. By translating domain wall movement into at least one magnetic vortex spin structure, it is possible to decouple identification of field movements or rotations from the counting of the number of revolutions, which enables a large window of action for rotation identification and a large number of revolutions that can be counted/measured.

In accordance with some exemplary embodiments, the device for moving includes a rotatable object configured to generate a rotating magnetic field which moves the domain wall in the domain wall channel structure. A relative rotation between domain wall channel structure and rotating object can be assumed here. In other words, either the object is rotating (domain wall channel structure is stationary), the domain wall channel structure is rotating (object is stationary) or both are rotating. Therefore, the magnetic field is rotating in a reference system of the domain wall channel structure.

In accordance with some exemplary embodiments, the magnetic field which is rotating (in the reference system of the domain wall channel structure) has field components in a principal plane of extent of the domain wall channel structure. That means that if the domain wall channel structure extends in an x-y-plane, for example, then the rotating magnetic field has field components in the x- and/or y-direction (in-plane).

In accordance with some exemplary embodiments, the domain wall channel structure is configured such that it is curved at least in sections. The curvature can be adapted to the rotation. In this regard, the domain wall channel structure can be configured such that it is in the shape of an arc of a circle (concave, convex), ring-shaped or spiral, for example. Such shaping of the domain wall channel structure enables good movement of the domain wall in the domain wall channel structure by means of a rotating magnetic field.

In accordance with some exemplary embodiments, the domain wall channel structure includes a ferromagnetic (e.g., iron, nickel and cobalt, ferromagnetic alloys) or ferrimagnetic material (e.g., ferrite or ferrimagnetic garnets).

In accordance with some exemplary embodiments, the domain wall channel structure has an initial region configured to generate the domain wall in the initial region in response to a rotating external magnetic field. For this purpose, the initial region can have a suitable geometry, for example, in which domain walls form particularly easily in response to external magnetic fields.

Additionally or alternatively, the device for generating and storing includes a magnetic injection structure for generating the magnetic vortex spin structure in response to the domain wall moved in the domain wall channel structure and includes a magnetic reservoir structure, coupled to the injection structure, for the magnetic vortex spin structure generated in the injection structure. In this case, the injection structure and the reservoir structure can be configured in integral or monolithic fashion. Injection structure and reservoir structure can differ in their respective geometry and material, for example.

In accordance with some exemplary embodiments, at least the injection structure is positioned in a vicinity of the domain wall channel structure such that in the injection structure the at least one magnetic vortex spin structure is nucleated in response to a magnetic stray field of the domain wall moved in the domain wall channel structure. In other words, at least one magnetic vortex spin structure can be generated in the injection structure by the stray field.

In accordance with some exemplary embodiments, the injection structure and the reservoir structure each include a stack structure composed of a heavy metal (Pt, Ta, Ir, W, etc.), a magnetic material (Co, Fe, Ni, CoFeB, CoSiB, CoB, etc.) and an insulating material (AlOx, MgO, etc.). One example would be a layer stack Ta/CoFeB/MgO.

In accordance with some exemplary embodiments, a magnetic material of the injection structure and/or of the reservoir structure is configured as an ultrathin magnetic film and has a preferred magnetization direction perpendicular to the layer plane (out-of-plane) in order that magnetic vortex spin structures can be stored well.

In accordance with some exemplary embodiments, the injection structure is arranged laterally next to the domain wall channel structure—specifically in a vicinity, such that a magnetic stray field of the domain wall can interact with the injection structure in order to generate one or more magnetic vortex spin structures in the injection structure in response to the stray field.

In accordance with some exemplary embodiments, the domain wall channel structure is configured such that it is spiral, and the injection structure is arranged at one end of the spiral domain wall channel structure. The injection structure can be characterized for example by a suitable geometry for forming magnetic vortex spin structures.

In accordance with some exemplary embodiments, the domain wall channel structure is configured such that it is spiral, and a first injection and reservoir structure is arranged on or adjacent to one turn of the spiral domain wall channel structure and a second injection and reservoir structure is arranged on or adjacent to a different turn of the spiral domain wall channel structure. In other words, two reservoirs and means can be used, which ensure that the number of magnetic vortex spin structures in both reservoirs differs by a constant value (e.g., 1 or 15). A magnetic moment of one reservoir can be compared with the difference between the moments of both reservoirs. The result is the moment of the one reservoir in units of the constant difference. This method can cancel out process and temperature drifts of a magnetization that can be caused by magnetic vortex spin structures (skyrmions or the like) and also by a read-out element. The different number of magnetic vortex spin structures in the two reservoirs can be achieved by both reservoirs being coupled to a spiral, wherein the injector of one reservoir can be positioned directly after the first bend of the spiral, while the injector of the other reservoir can be positioned after a plurality of bends or loops of the spiral. As a result, the second reservoir will have fewer magnetic vortex spin structures than the first.

In accordance with some exemplary embodiments, the injection structure has a geometry dependent on a domain wall movement or rotation direction to be detected. By way of example, by virtue of suitable asymmetries of the injection structure, magnetic vortex spin structures can be injected only in the case of rotations of the magnetic field and/or of the domain wall channel structure in the clockwise or counterclockwise direction.

Additionally or alternatively, the injection structure has a relative position with respect to the domain wall channel structure that is dependent on a domain wall movement or rotation direction to be detected.

In accordance with some exemplary embodiments, the apparatus for generating magnetic vortex spin structures includes an evaluation device for determining a number of stored magnetic vortex spin structures in the reservoir structure.

In accordance with some exemplary embodiments, the evaluation device has a magnetic sensor in order to determine the number of stored magnetic vortex spin structures. This can involve for example a Hall sensor and/or a magnetoresistive sensor (anomalous Hall effect—AHE, anomalous Nernst effect—ANE, TMR, etc.).

In accordance with some exemplary embodiments, the evaluation device is configured to transport the stored magnetic vortex spin structures from a magnetic reservoir structure and to sense magnetic vortex spin structures transported from the reservoir structure by means of a magnetic sensor. In this case, the magnetic sensor can be arranged at an output of the reservoir structure. By way of example, magnetic vortex spin structures can be transported by mechanical stress, in a voltage-controlled manner (electrical voltage), in a current-controlled manner or in a magnetic field-controlled manner.

In accordance with some exemplary embodiments, the evaluation device is configured to transport the stored magnetic vortex spin structures from the reservoir structure by injection of an electric current. In this case, the electric current should not exceed a predetermined current intensity since otherwise driving forces can become so great that magnetic vortex spin structures (e.g., skyrmions) cannot maintain their topology and change their magnetic spin structure or even collapse.

In accordance with some exemplary embodiments, the evaluation device includes a first magnetic reservoir structure for generated magnetic vortex spin structures and a second magnetic reservoir structure coupled to the first magnetic reservoir structure. The evaluation device is configured to transport generated magnetic vortex spin structures from the first reservoir structure to the second reservoir structure by means of electric current flow and to sense transported magnetic vortex spin structures by means of at least one magnetic sensor. The magnetic sensor can be arranged for example at a connecting web between the two reservoir structures.

In accordance with some exemplary embodiments, the apparatus includes a device for moving at least one magnetic domain wall in the clockwise direction in a first magnetic domain wall channel structure and a device for generating and storing at least one first magnetic vortex spin structure in response to the domain wall moved in the first domain wall channel structure. The apparatus furthermore includes a device for moving at least one magnetic domain wall in the counterclockwise direction in a second magnetic domain wall channel structure and a device for generating and storing at least one second magnetic vortex spin structure in response to the domain wall moved in the second domain wall channel structure. Such embodiments make it possible to identify rotations in different rotation directions.

In accordance with some exemplary embodiments, the apparatus for generating magnetic vortex spin structures furthermore includes an evaluation device for determining a number of generated first and second magnetic vortex spin structures. A relationship between rotations in the clockwise direction and rotations in the counterclockwise direction can thus be deduced.

In accordance with some exemplary embodiments, the evaluation device includes a Wheatstone bridge circuit having first resistance values proportional to the number of generated first magnetic vortex spin structures and having second resistance values proportional to the number of generated second magnetic vortex spin structures. Given suitable arrangement of the resistors in the Wheatstone bridge circuit, a difference voltage between the two half-bridges indicates a difference between rotations in the clockwise direction and rotations in the counterclockwise direction.

In accordance with a further aspect of the present disclosure, a method for generating magnetic vortex spin structures is proposed. The method includes moving at least one magnetic domain wall in a magnetic domain wall channel structure and generating and storing at least one magnetic vortex spin structure in response to the domain wall (or the magnetic stray field thereof) moved in the domain wall channel structure.

In accordance with a further aspect of the present disclosure, an apparatus for measuring a number of rotations of a magnetic field which is rotating in a reference system is proposed. The apparatus includes a ferro- or ferrimagnetic domain wall channel structure, in which a magnetic domain wall is movable by means of the rotating magnetic field, a magnetic storage structure configured to nucleate at least one magnetic vortex spin structure in the storage structure in response to the domain wall moved in the domain wall channel structure, and an evaluation device for determining the number of rotations by evaluating a number of magnetic vortex spin structures in the storage structure.

In accordance with a further aspect of the present disclosure, a method for measuring a number of rotations of a magnetic field which is rotating in a reference system is proposed. The method includes moving, by means of the rotating magnetic field, a magnetic domain wall in a ferro- or ferrimagnetic domain wall channel structure, nucleating, in response to the domain wall moved in the domain wall channel structure, at least one magnetic vortex spin structure in a magnetic storage structure, and determining the number of rotations by evaluating a number of magnetic vortex spin structures in the storage structure.

Exemplary embodiments of the present disclosure enable movements of domain walls to be translated into a number of magnetic vortex spin structures (e.g., skyrmions). It is thereby possible to realize multirotation sensors, for example.

BRIEF DESCRIPTION OF THE DRAWINGS

Some examples of apparatuses and/or methods are explained in greater detail merely by way of example below with reference to the accompanying figures, in which.

DETAILED DESCRIPTION

Some examples will now be described more thoroughly with reference to the accompanying figures. However, further possible examples are not restricted to the features of these embodiments described in detail. These may have modifications of the features and counterparts and alternatives to the features. Furthermore, the terminology used herein for describing specific examples is not intended to be limiting for further possible examples. In particular, a number of different spin structures such as skyrmions, skyrmionium, merons, and the like can be used as magnetic vortex spin structures.

Throughout the description of the figures, identical or similar signs refer to identical or similar elements or features which can be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, i.e., only A, only B, and A and B, unless expressly defined otherwise in an individual case. As alternative wording for the same combinations, it is possible to use "at least one from A and B" or "A and/or B". That applies equivalently to combinations of more than two elements.

If a singular form, e.g., "a, an" and "the", is used and the use of only a single element is defined neither explicitly nor implicitly as obligatory, further examples can also use a plurality of elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof.

Figure 1A:
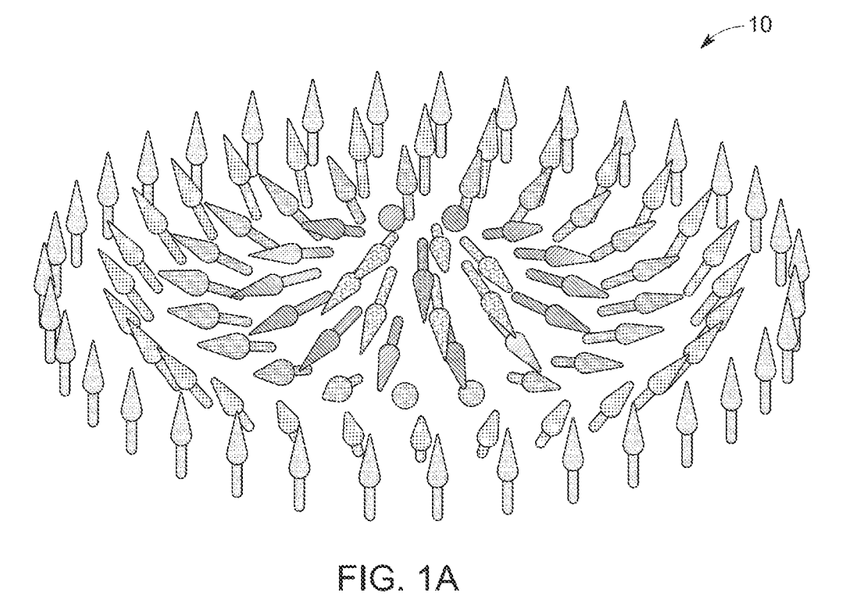
FIGS. 1A and 1B show schematic illustrations of a magnetic skyrmion as one example of a magnetic vortex spin structure.
Figure 1B:
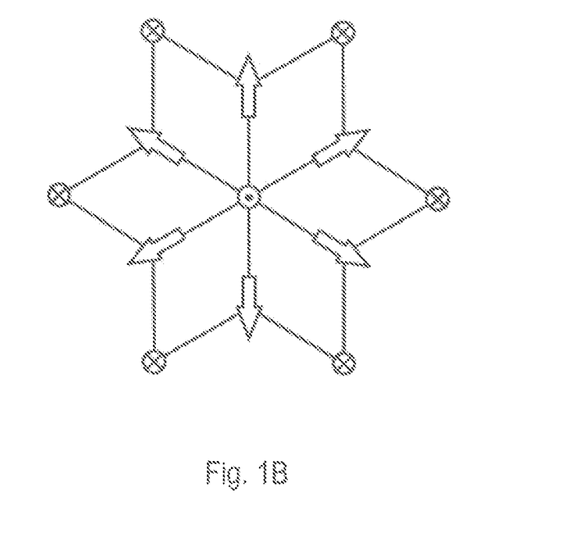

Skyrmions are named after the nuclear physicist Tony Skyrme, who in the 1960s developed a nonlinear field theory for interacting p-ions and showed that topologically stable field configurations occur as particle-like solutions. Nowadays the word skyrmion is used to refer to similar mathematical objects in many different contexts, from elementary particles through to liquid crystals, Bose-Einstein condensates and Quantum Hall magnets. Magnetic skyrmions are chiral spin structures having a vortexlike configuration and there are various manifestations of such magnetic vortex spin structures, such as topologically trivial magnetic bubbles, skyrmions with higher topological charge, skyrmionium, merons, etc. One typical example of a magnetic vortex spin structure is a skyrmion. As is shown schematically in FIGS. 1A and 1B, in a magnetic skyrmion 10 a magnetization in the interior points in a direction preferred by the material. In the outer region it points in the opposite direction. In the transition region, the so-called domain wall, the magnetization rotates constantly between these two states. On account of the compactness of the structure, the domain wall winds into a closed ring-shaped loop. Since its structure cannot be deformed continuously into a ferromagnetic or other magnetic state, skyrmions 10 are topologically protected and relatively stable structures, in comparison with e.g., magnetic vortices or bubbles. Skyrmions can be generated in magnetic materials by means of nucleation magnetic fields, for example, and be disintegrated again by means of annihilation magnetic fields. Other nucleation and annihilation mechanisms (e.g., electric currents, geometries, etc.) are also possible. Suitable skyrmion carrier materials are, for example, stack structures composed of heavy metals (Pt, Ta, Ir, W, etc.), magnetic materials (Co, Fe, Ni, CoFeB, CoSiB, CoB, etc.) and an insulating material (AlOx, MgO, etc.). One example of a material in which skyrmions can form is a layer stack composed of Ta/CoFeB/MgO.

Figure 2:
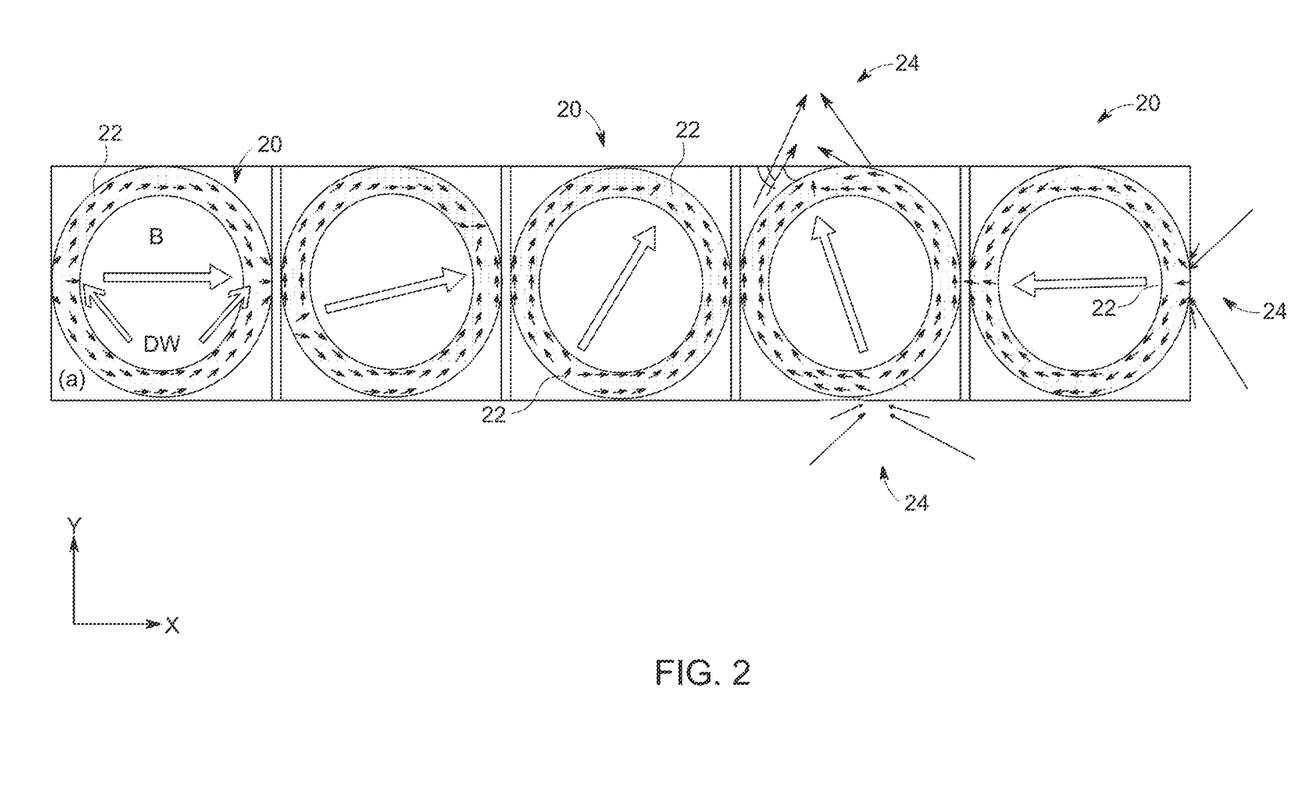
FIG. 2 shows an illustration of rotating domain walls as a result of a rotating magnetic field.

The present disclosure considers magnetic stray fields of moving magnetic domain walls as a nucleation magnetic field for skyrmions. FIG. 2 shows a body 20 configured as a ferromagnetic ring, which is also referred to hereinafter as a domain wall channel structure 20. The domain wall channel structure 20 here spans an x-y-plane by way of example. An external magnetic field B which is rotating in the x-y-plane generates in the ring-shaped domain wall channel structure 20 magnetic domain walls 22 between regions in which differently oriented domains meet one another. The domain walls 22 concomitantly move in the domain wall channel structure 20 synchronously with the rotating magnetic field B. In this respect, the body 20 serves as a domain wall channel. In the ring-shaped domain wall channel structure 20 in FIG. 2, two domain walls 22 form in an opposing manner at an angle of 180° in accordance with the magnetic field B which is rotating in the x-y-plane. As is indicated in FIG. 2 (on the right), magnetic stray fields 24 projecting radially outward or inward in each case are associated with the magnetic domain walls 22 in the ring-shaped domain wall channel structure 20.

The present disclosure makes use of the fact that skyrmions can be generated (nucleated) and stored in suitable magnetic skyrmion carrier structures by means of the magnetic stray fields 24 associated with the domain walls 22. Whenever a domain wall 22 that is moved in the domain wall channel structure 20 is moved past a skyrmion carrier structure, a skyrmion or a defined number of skyrmions can be generated and stored in the skyrmion carrier structure. Consequently, for example, a number of rotations can be deduced on the basis of the generated and stored skyrmions. No external electrical energy is needed for the generation and storage of the skyrmions.

Figure 3:
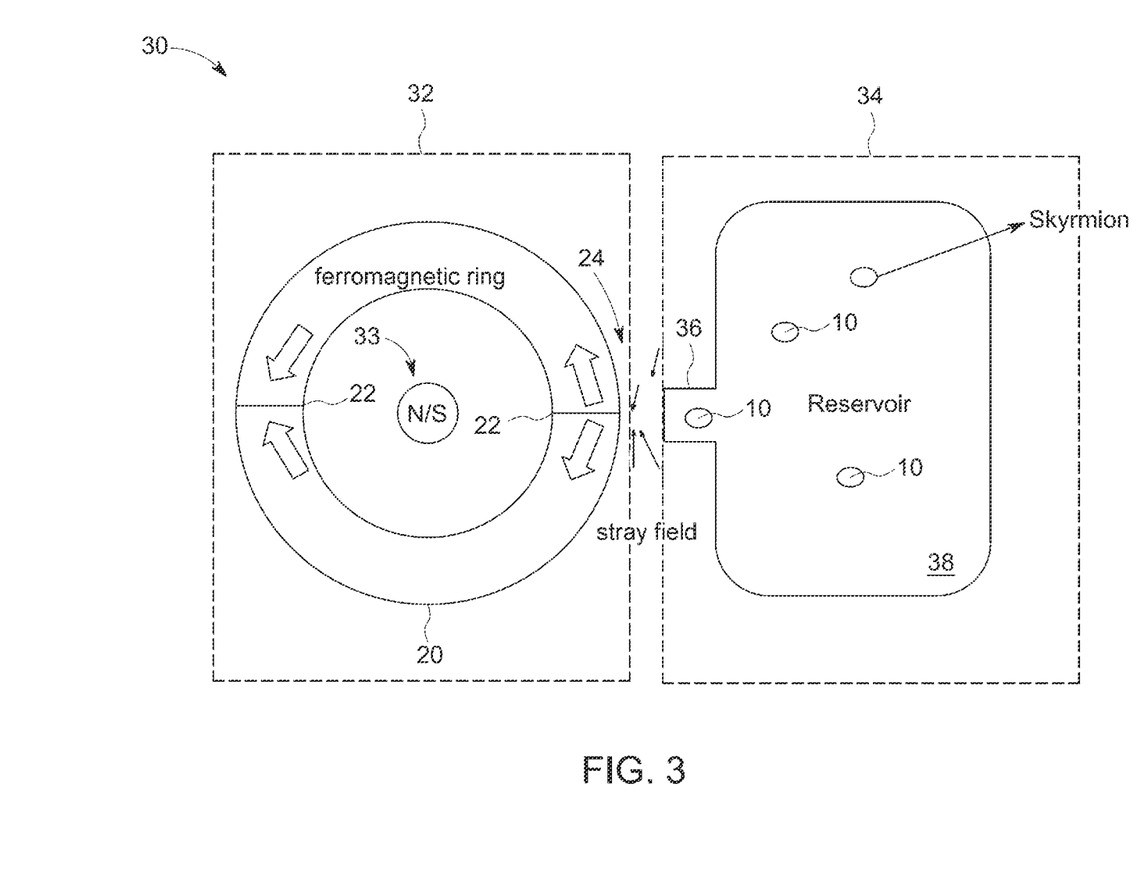
FIG. 3 shows an apparatus for generating skyrmions in accordance with one exemplary embodiment of the present disclosure.

The basic concept of the present disclosure is explained with reference to FIG. 3, which shows a schematic illustration of an apparatus 30 for generating magnetic vortex spin structures, such as e.g., skyrmions, in accordance with the present disclosure.

The apparatus 30 comprises a device 32 for moving at least one magnetic domain wall 22 in a magnetic domain wall channel structure 20, configured here as a ferro- or ferrimagnetic ring by way of example. As will also be explained below, other geometries of the domain wall channel structure 20 are also possible. The apparatus 30 furthermore comprises a device 34 for generating and storing at least one magnetic vortex spin structure (e.g., in the form of a skyrmion) 10 in response to the magnetic domain wall 22 moved in the domain wall channel structure 20.

The device 32 for moving can comprise an object 33 that is rotatable relative to the domain wall channel structure 20. This can involve for example a shaft, a wheel, or a similar rotatable object. The object 33 can be configured for example to generate an external magnetic field of the order of magnitude of 5 mT-100 mT, for example, which is rotating relative to the domain wall channel structure 20 and thus moves the domain walls 22 in the domain wall channel structure 20 (in the rotation direction). The relative movement or rotation between domain wall channel structure 20 and object 33 can be effected by movement/rotation of the object 33 and/or by movement/rotation of the domain wall channel structure 20, which in both cases has the consequence that the external magnetic field is moving/rotating in the reference system of the object 33 or of the domain wall channel structure 20. Object 33 and ring-shaped domain wall channel structure 20 can be arranged concentrically, for example.

It is assumed below that the object 33 is a shaft with a permanent magnet at one end of the shaft for generating the external magnetic field. The ring-shaped domain wall channel structure 20 is stationary relative thereto. A rotation of the shaft causes the magnetic field to rotate and thus also to move the two opposing domain walls 22 in the domain wall channel structure 20.

Radially outside the ring-shaped domain wall channel structure 20, the device 34 for generating and storing has a magnetic injection structure 36 for generating skyrmions in response to the domain walls 22 moved in the domain wall channel structure 20, and a magnetic reservoir structure 38, coupled to the injection structure 36, for the skyrmions generated in the injection structure 36. It goes without saying that injection structure 36 and/or reservoir structure 38 could also be arranged inside, below or above the ring 20. The injection structure 36 can be arranged laterally next to the domain wall channel structure 20 spanning the x-y-plane.

The magnetic injection structure or skyrmion injector 36 and reservoir structure or skyrmion reservoir 38 can be configured in integral (monolithic) fashion. Suitable materials for the skyrmion injector 36 and the skyrmion reservoir 38 are, for example, stack structures composed of a heavy metal (Pt, Ta, Ir, W, etc.), a magnetic material (Co, Fe, Ni, CoFeB, CoSiB, CoB, etc.) and an insulating material (AlOx, MgO, etc.), for example a thin layer stack composed of Ta/CoFeB/MgO. The skyrmion injector 36 and the skyrmion reservoir 38 can each be configured as an ultrathin magnetic film and have a preferred magnetization direction perpendicular to the layer plane (pointing out of the plane of the drawing). Although the skyrmion reservoir 38 is illustrated as substantially rectangular with rounded corners in FIG. 3, other geometries of the skyrmion reservoir 38 are also conceivable, such as e.g., round or circular.

The skyrmion injector 36 can be positioned in the vicinity of the domain wall channel structure 20 such that skyrmions 10 are nucleated in the skyrmion injector 36 in response to the magnetic stray field 24 of the domain wall 22 moved in the domain wall channel structure 20. The skyrmion injector 36 can protrude or project from the skyrmion reservoir 38 in the direction of the domain wall channel structure 20 and have a geometry suitable for nucleation (e.g., narrow web). The distance between domain wall channel structure 20 and skyrmion injector 36 should thus be dimensioned such that the stray field 24 at the location of the skyrmion injector 36 is sufficient for the nucleation of skyrmions 10 in the skyrmion injector 36. Whenever a domain wall 22 rotates past the skyrmion injector 36, a predefined number of skyrmions 10 are generated. Per 360° rotation, therefore, the predefined number of skyrmions 10 is generated two times in the present case, such that a number of rotations can be deduced on the basis of the skyrmions 10 situated in the skyrmion reservoir 38.

A possible rotation detection in accordance with exemplary embodiments of the present disclosure can thus be summarized in general as follows:

A magnetic excitation (field rotation that can be measured) is defined by a magnetic field which is rotating in the plane.

The magnetic field which is rotating in the plane rotates e.g., two domain walls 22 inside a ferromagnetic ring 20 with in-plane magnetic anisotropy. The magnetization vector of the rotating magnetic field thus lies in the plane of the (thin) ring 20.

A domain wall 22 generates a stray field 24 outside the ring material.

The stray field 24 nucleates a magnetic skyrmion 10 in the injection or reservoir structure 38. In contrast to the ring 20, the reservoir structure 38 can have an easy axis for the magnetization out of the plane of the flat reservoir in order to enable a defined skyrmion nucleation and a stable storage state. One example of a reservoir material stack is Ta/CoFeB/MgO.

The skyrmion 10 in the interior of the reservoir 38 is stable in a specific magnetic and temperature window.

The number of skyrmions 10 scales with the number of rotations. In the case of the ferromagnetic ring structure 20 mentioned above, a new skyrmion is generated upon each half revolution. The case is similar with a ferromagnetic (open) spiral structure for the nucleation of skyrmions.

The skyrmion nucleation and skyrmion storage in the interior of the reservoir do not require any electric current or energy—this is totally energy-free!

By means of exemplary embodiments of the present disclosure, a large number of skyrmions (>>16) can thus be stored in a reservoir (limited by reservoir size/skyrmion size). An associated decoupling of the rotation detection (in-plane DW movement) from the information storage (skyrmion) can offer a higher magnetic stability in comparison with known solutions and thus a larger magnetic field range for operation.

Figure 4:
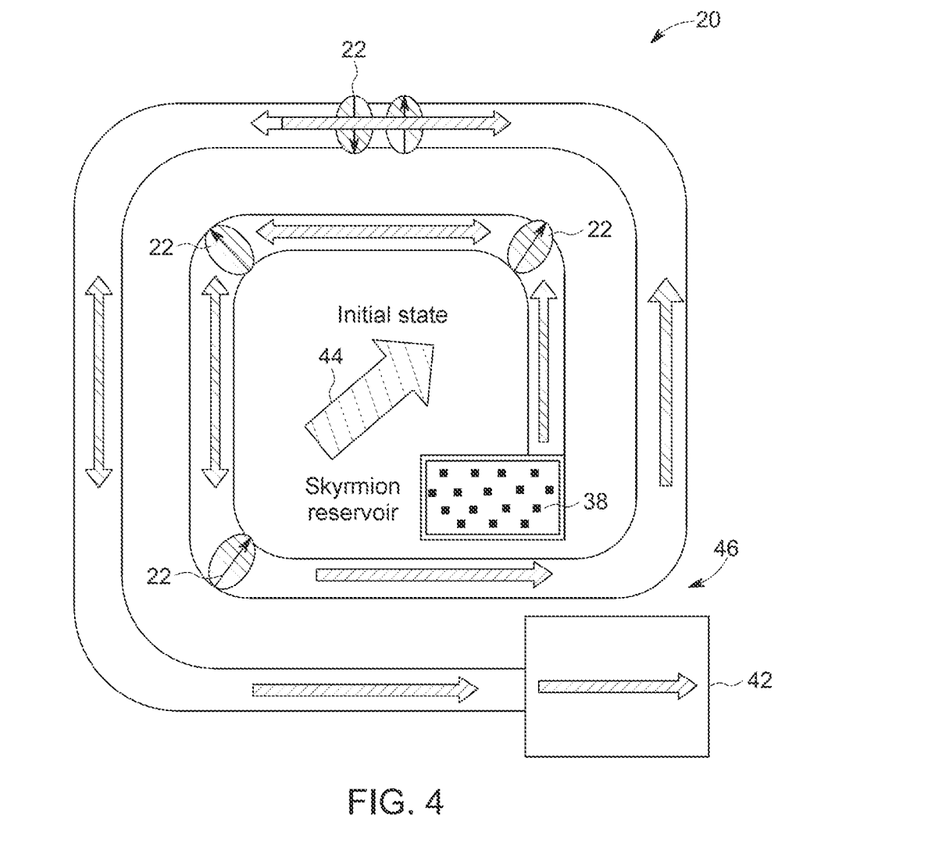
FIG. 4 shows a spiral domain wall channel structure with skyrmion reservoir.

FIG. 4 shows one embodiment of the present disclosure which makes it possible to determine not only a number of rotations but also a rotation direction.

The ferro- or ferrimagnetic domain wall channel structure 20 shown in FIG. 4 is configured as a spiral. Merely by way of example, two turns of the spiral domain wall channel structure 20 are illustrated and various possible positions of the domain walls 22 and the direction of magnetization as arrows are illustrated. At some points, as examples arrows are depicted in both directions, which is intended to indicate that by way of example a domain wall that moves across this region rotates the magnetization direction. The spiral domain wall channel structure 20 has an initial region (domain wall generator) 42 configured to generate a domain wall 22 in the initial region 42 in response to a rotating external magnetic field. The initial region 42 can be characterized for example by a special geometry that facilitates domain wall formation. By means of a magnetic field 44 rotating in the clockwise direction, a domain wall 22 can be moved from the initial region 42 into the spiral domain wall channel structure 20. After a first rotation, the domain wall 22 is situated at a position in the domain wall channel structure 20. A skyrmion reservoir 38 (+ injector) is arranged at the end of the second turn. After a second 360° rotation of the magnetic field 44, the domain wall 22 is thus situated at the end of the spiral domain wall channel structure 20 and generates a defined number of skyrmions in the skyrmion reservoir 38. If the magnetic field 44 is rotating in the counterclockwise direction, domain walls situated in the domain wall channel structure 20 move in the counterclockwise direction. The number of skyrmions increments only upon rotation of the magnetic field in the clockwise direction. A rotation of the magnetic field in the counterclockwise direction does not alter the number of skyrmions in the reservoir 38 (in particular it does not draw the skyrmions from the reservoir).

Although the movement of the domain walls 22 in the spiral domain wall channel structure 20 allows the counting of revolutions by means of the spiral domain wall channel structure 20, these revolutions, without a skyrmion reservoir 38, are currently technically limited to 16 revolutions. One approach thus consists in converting the domain walls 22 into skyrmions 10 according to the concept disclosed herein when they reach the end of the spiral domain wall channel structure 20. In the simplest case, rather than using a full spiral having many turns, a spiral having one turn is used. When the domain walls 22 arrive at the end of the spiral domain wall channel structure 20, they are inserted into the skyrmion reservoir 38, where they are stored as skyrmions. Hybrid systems are also conceivable, in which a few rotations are stored in a spiral, while a larger number are stored in a skyrmion reservoir 38. One advantage of this approach is that by virtue of the spiral shape the rotation direction can automatically be identified (at least easily for a small number of revolutions that can be sensed within the spiral).

Figure 5:
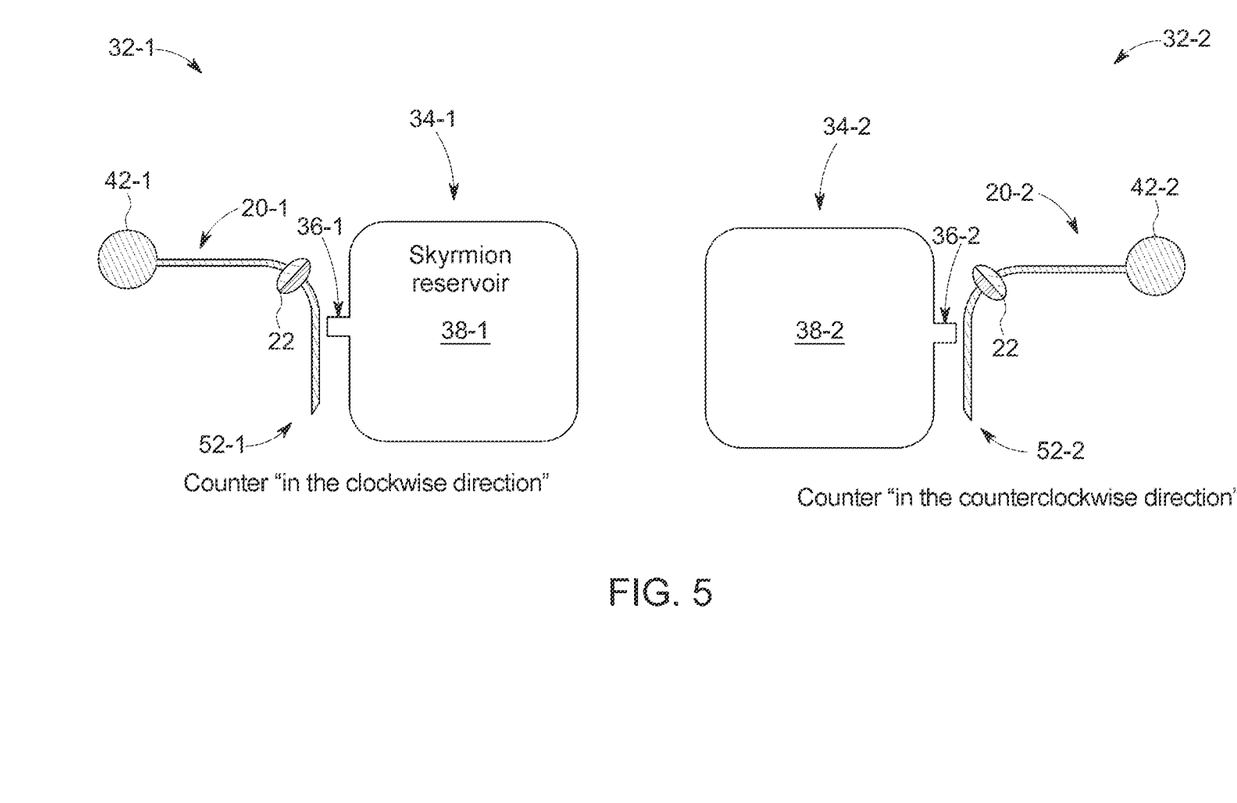
FIGS. 5 and 6 show schematic illustrations of skyrmion-based revolution counters in the clockwise and counterclockwise directions.

FIG. 5 illustrates a further exemplary embodiment which makes it possible to determine not only a number of rotations but also a rotation direction.

FIG. 5 (on the left) shows a first device 32-1 for moving at least one magnetic domain wall 22 in the clockwise direction in a first magnetic domain wall channel structure 20-1 and a first device 34-1 for generating and storing at least one first skyrmion in response to the domain wall moved in the first domain wall channel structure 20-1. FIG. 5 (on the right) furthermore shows a second device 32-2 for moving at least one magnetic domain wall in the counterclockwise direction in a second magnetic domain wall channel structure 20-2 and a second device 34-2 for generating and storing at least one second skyrmion in response to the domain wall moved in the second domain wall channel structure 20-2.

FIG. 5 shows a first domain wall channel structure 20-1 operatively connected to a first skyrmion reservoir 38-1 and a second domain wall channel structure 20-2 operatively connected to a second skyrmion reservoir 38-2. The first domain wall channel structure 20-1 is curved as an open loop (e.g., quarter loop) in the clockwise direction from an initial region 42-1 to an end region 52-1, and the second domain wall channel structure 20-2 is curved as an open loop (e.g., quarter loop) in the counterclockwise direction from an initial region 42-2 to an end region 52-2. Domain walls 22 can be generated in the respective initial regions 42 in each case in response to an external magnetic field which is rotating (in the clockwise or counterclockwise direction). The respective end regions 52 of the domain wall channel structures 20-1, 20-2 can be configured as a sharp tip for domain wall annihilation. The skyrmion reservoirs 38-1, 38-2 have respective skyrmion injectors 36-1, 36-2 facing the respective domain wall channel structures 20-1, 20-2. Upon rotation of the magnetic field in the clockwise direction, skyrmions are generated and stored in the first skyrmion reservoir 38-1; upon rotation of the magnetic field in the counterclockwise direction, skyrmions are generated and stored in the second skyrmion reservoir 38-2.

FIG. 5 shows one example of a simple ferromagnetic loop structure for identifying the rotation direction—a quarter loop. The identification of the rotation direction is defined by the chirality of the loop structure 20-1, 20-2. One advantage is a short length of the loops 20-1, 20-2, which from the standpoint of processing engineering enables a very low probability of structural defects and thus an extended magnetic field range for operation. The field of the rotating magnet need only act on the respective domain wall generator 42, which is small and, therefore, the field is well defined and homogeneous there.

Figure 6:
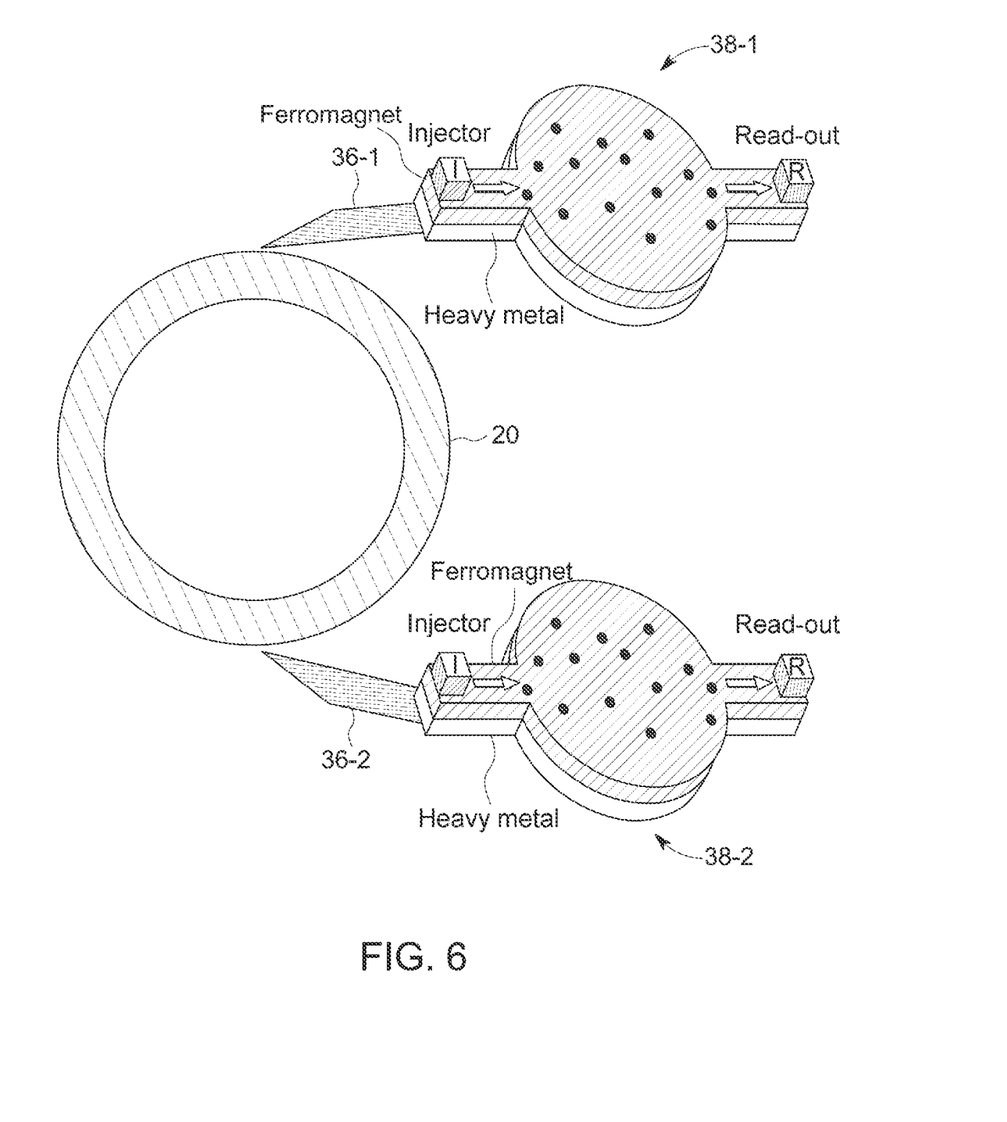

FIG. 6 illustrates a further exemplary embodiment with two skyrmion reservoirs, wherein each reservoir is filled only for one rotation direction.

The two skyrmion reservoirs 38-1, 38-2 here are arranged on opposite sides of a domain wall channel structure 20 configured as a ferromagnetic ring (e.g., at the top and bottom). The skyrmion reservoirs 38-1, 38-2 each have asymmetrically designed skyrmion injectors 36-1, 36-2. The upper skyrmion injector 36-1 nucleates skyrmions only when domain walls in the domain wall channel structure 20 or the stray fields thereof move past the skyrmion injector 36-1 in the clockwise direction. The lower skyrmion injector 36-2 nucleates skyrmions only when domain walls in the domain wall channel structure 20 or the stray fields thereof move past the skyrmion injector 36-2 in the counterclockwise direction. The skyrmion injectors 36-1, 36-2 thus have a geometry dependent on a domain wall movement direction to be detected. A number of skyrmions in the first skyrmion reservoir 38-1 thus indicates a number of revolutions in the clockwise direction, whereas a number of skyrmions in the second skyrmion reservoir 38-2 indicates a number of revolutions in the counterclockwise direction.

In order to determine a number of revolutions, a number of skyrmions which were generated and stored in a skyrmion reservoir 38 can be read out. This can be done in various ways.

A skyrmion reservoir can be read out for example directly by way of a magneto-transport effect, since each skyrmion 10 increases a magnetization in the z-direction and this change can be detected (e.g., anomalous Hall effect—HAE, anomalous Nernst effect—ANE, TMR, etc.). If a skyrmion reservoir 38 is suitably structured, it is also possible to determine a position of the skyrmions during injection and to find thermal equilibrium positions, such that local read-out is also possible (rather than read-out of the magnetization of the entire reservoir all at once).

In accordance with one embodiment, it is possible to use two skyrmion reservoirs and means that ensure that the number of skyrmions in the two skyrmion reservoirs differs by a constant value (e.g., 1 or 15). The magnetic moment of one skyrmion reservoir can then be compared with the difference between the moments of both reservoirs. The result is the moment of said one skyrmion reservoir in units of the constant difference. The different number of skyrmions in the two skyrmion reservoirs can be achieved for example by both reservoirs being coupled to a spiral, wherein the skyrmion injector of one skyrmion reservoir is positioned directly after the first bend of the spiral, while the skyrmion injector of the other skyrmion reservoir is positioned after a plurality of bends or loops of the spiral. The second reservoir will then have fewer skyrmions than the first.

Figure 7:
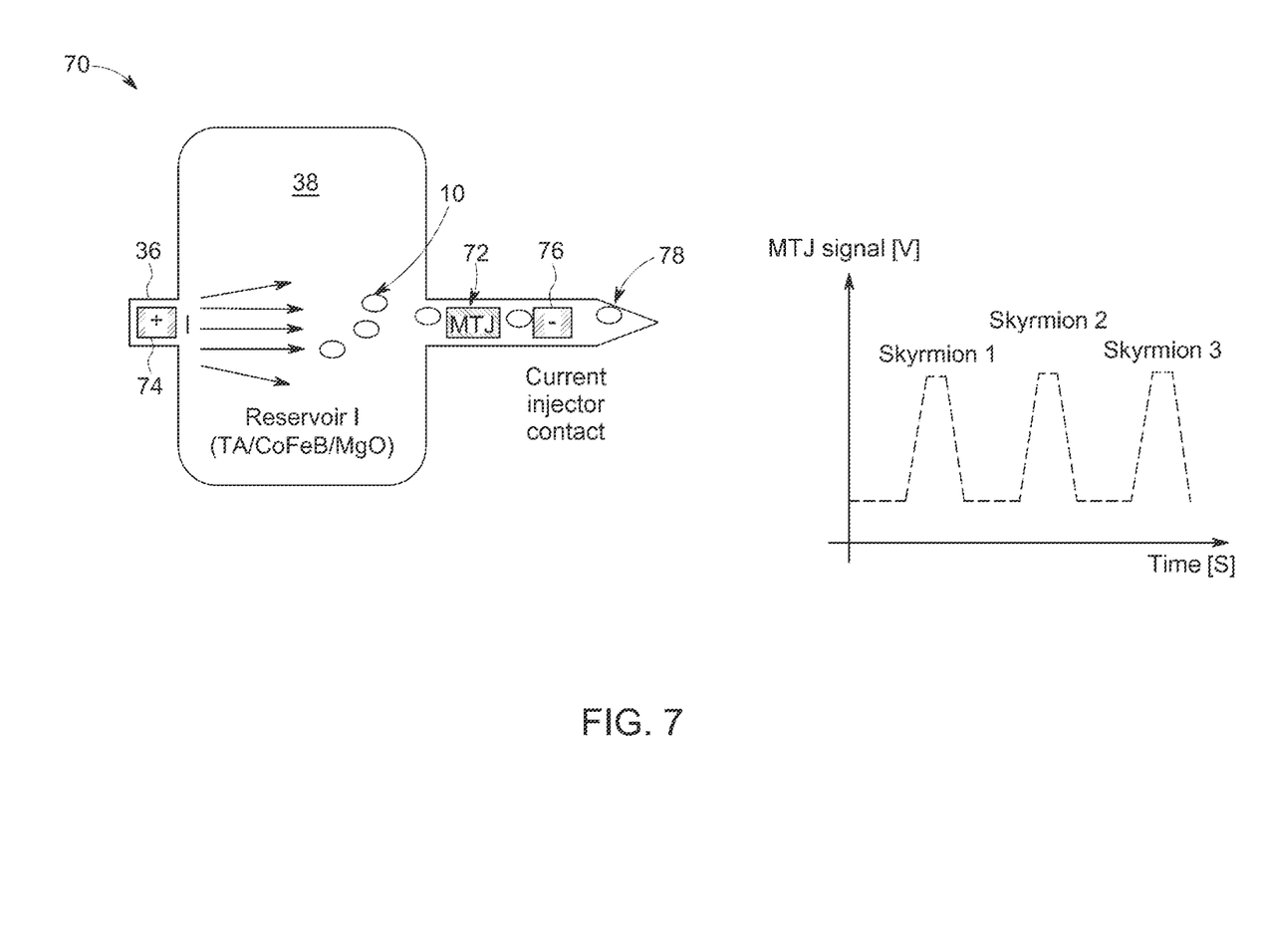
FIG. 7 shows a first concept for reading out skyrmion reservoirs.

FIG. 7 shows one exemplary embodiment of a skyrmion reservoir 38 with an evaluation device 70 for determining a number of skyrmions 10 stored in the skyrmion reservoir 38.

The evaluation device 70 is configured to transport the stored skyrmions 10 from the skyrmion reservoir 38 and to sense skyrmions transported from the skyrmion reservoir 38 by means of a magnetic field sensor 72. In this case, the magnetic field sensor 72 (e.g., Hall sensor, xMR sensor) is arranged at an output of the skyrmion reservoir 38, for example at an output-side read-out web. In the example depicted schematically in FIG. 7, skyrmions are transported from the skyrmion reservoir 38 into the read-out web in a current-controlled manner. The evaluation device 70 here is thus configured to transport the stored skyrmions by injection of an electric current from the skyrmion reservoir 38 into the read-out web. In this case, the electric current should not exceed a predetermined current intensity since otherwise driving forces can become so great that skyrmions cannot maintain their topology and collapse. For the current flow, electrodes 74, 76 for forming an electric field in the skyrmion reservoir 38 are arranged on the input side (e.g., at the injector 36) and on the output side of the skyrmion reservoir 38. The read-out web of the skyrmion reservoir 38 can have a sharp tip 78 at the end for domain wall annihilation.

In the case of the arrangement depicted schematically in FIG. 7, the skyrmions 10 can be shifted from the reservoir 38 into a read-out path (read-out web), where that can be detected by way of a magneto-transport effect such as the anomalous Hall effect or a TMR junction. After the skyrmion has been detected, the structure can be designed (tip) such that the skyrmion is annihilated.

Figure 8:
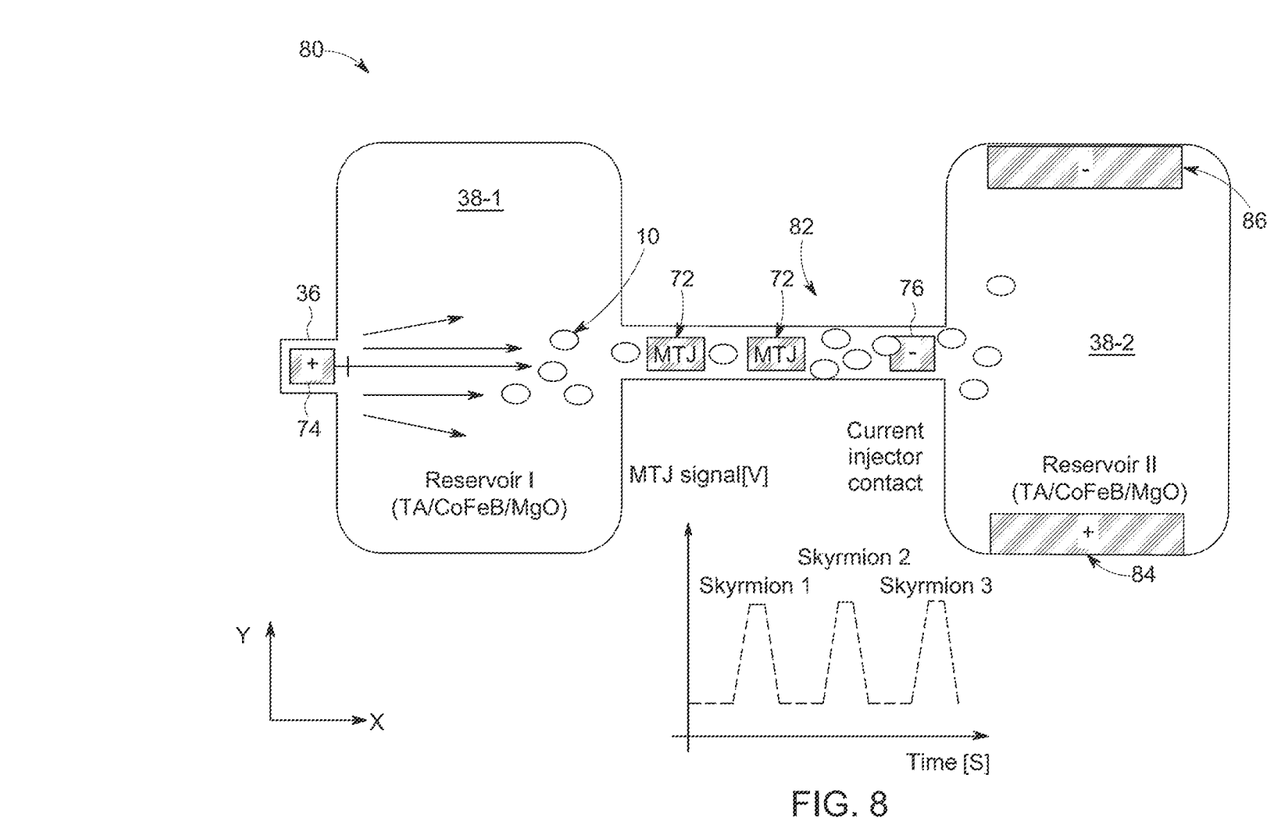
FIG. 8 shows a second concept for reading out skyrmion reservoirs.

FIG. 8 shows another possible form of evaluation by means of two skyrmion reservoirs connected in series.

The evaluation device 80 shown in FIG. 8 has a first skyrmion reservoir 38-1 for generated skyrmions and a second skyrmion reservoir 38-2 coupled to the first skyrmion reservoir 38-1. The first skyrmion reservoir 38-1 is coupled to a domain wall channel structure (not shown). The evaluation device 80 in FIG. 8 is configured to transport generated skyrmions by means of electric current flow from the first skyrmion reservoir 38-1 to the second skyrmion reservoir 38-2 and in the process to sense transported skyrmions by means of at least one magnetic sensor 72. The two skyrmion reservoirs 38-1 are connected to one another by a read-out web 82, for example, at which one or more magnetic field sensors 72 can be positioned. The magnetic field sensors 72 can be sensitive to magnetic field components in the z-direction, for example. For the read-out current, electrodes 74, 76 for forming an electric field in the x-direction in the skyrmion reservoir 38-1 are arranged on the input side (e.g., at the injector 36) and on the output side of the first skyrmion reservoir 38-1 (e.g., at the read-out web 82). For a thermal reset (erasure of the skyrmions read out), the second skyrmion reservoir 38-2 has reset electrodes 84, 86.

Various effects (e.g., spin-orbit torques by way of currents, external field gradients, laser pulses) can be used for shifting the skyrmions from the first skyrmion reservoir 38-1, which can be coupled to the ferromagnetic ring 20, into a second skyrmion reservoir 38-2. On the path between these two reservoirs, an electrical signal that is proportional to the Mz magnetization and thus dependent on the presence of skyrmions in the read-out web 82 can be read out by way of the magnetic tunnel effect (MTJ/TMR) or the anomalous Hall effect (AHE). The magnitude and the sign of the current fed into the two small current contacts 74, 76 are crucial: the skyrmions move in the direction of the current flow. The skyrmions move faster when the current is larger. The circuit should adapt the magnitude of the current in order that the first skyrmion reservoir 38-1 is not thermally reset. Moreover, in the case of an excessively large current, the frequency of the pulses becomes very high (>100 MHz) and this can lead to problems with the electronic counter. One possible strategy is to begin with a low current and to increase the latter depending on the counting rate until it reaches a predefined upper limit that is significantly below the thermal reset. Furthermore, the current density distribution in the skyrmion reservoir 38-1 can be designed such that the magneto-transport efficiency is optimized. This can be achieved by means of an optimized coordination between electrode and reservoir geometries.

After the counting of the skyrmions by way of the read-out web 82, the second skyrmion reservoir 38-2 can be reset by a heat pulse generated, for example, by a reset current. Alternatively, the skyrmions can be shifted back into the first skyrmion reservoir 38-1 again in order to generate the original state and to check the result of the first skyrmion counting.

Figure 9:
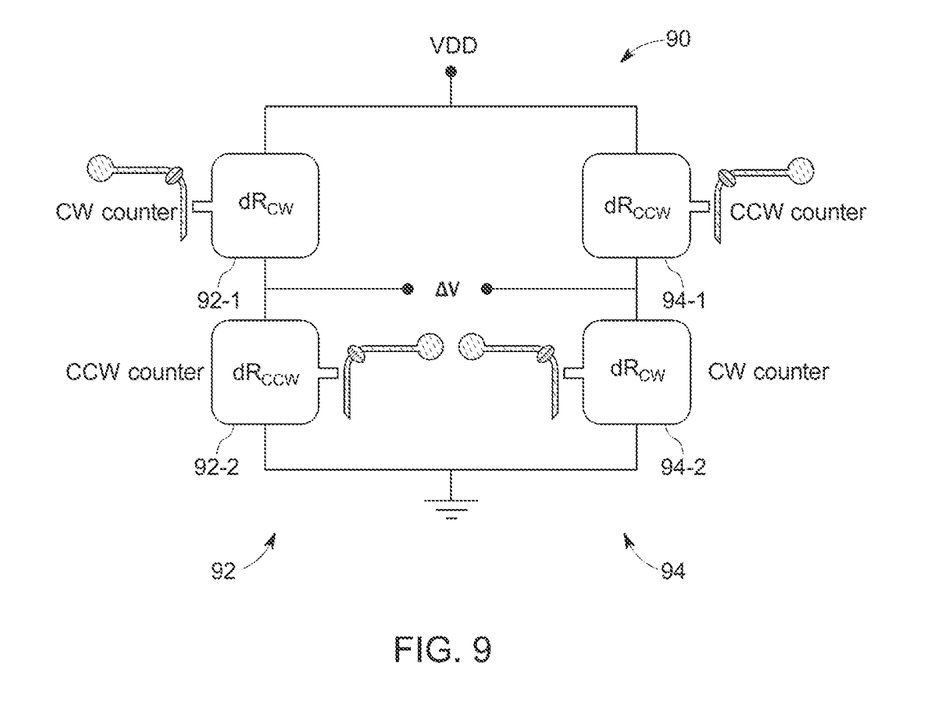
FIG. 9 shows a bridge circuit for determining a difference between revolutions in the clockwise and counterclockwise directions.

FIG. 9 shows a schematic Wheatstone full-bridge arrangement 90 for measuring a difference between a number of revolutions in the clockwise direction (CW rotations) and a number of revolutions in the counterclockwise direction (CCW rotations). A net number of revolutions can thus be determined.

The Wheatstone full-bridge 90 comprises a left half-bridge branch 92 having two series-connected magnetoresistive resistors 92-1, 92-2 and a right half-bridge branch 94 having two series-connected magnetoresistive resistors 94-1, 94-2. The magnetoresistive resistors 92-1 and 94-2 are assigned to a device for generating and storing skyrmions in response to revolutions in the clockwise direction (CW). The magnetoresistive resistors 92-2 and 94-1 are assigned to a device for generating and storing skyrmions in response to revolutions in the counterclockwise direction (CCW) (see e.g., FIG. 5). An output voltage $\Delta V$ of the Wheatstone full-bridge 90 is proportional to the difference in the number of skyrmions generated by CW rotation and CCW rotation and thus to the net rotational position.

There are specific rotational positions of an applied magnetic field (i.e., of the permanent magnet) in which a domain wall is situated exactly at the injector 36 of a reservoir 38. If a rotary object (e.g., shaft) remains in this angular position with tiny oscillations around this point, this could generate an undesirably high number of skyrmions. If the injector 36 has a specific tapered geometry in order to inject skyrmions only for one rotation direction, as in FIG. 6, this is better than in FIG. 3, where the injector injects skyrmions for clockwise rotation and counterclockwise rotation. FIG. 6 has the additional advantage that the net rate of rotation (=difference between CW and CCW skyrmions) is not influenced by vibrations since CW and CCW injectors are situated exactly opposite one another and, therefore, a small CW movement increases the CW reservoir number, while a succeeding small CCW movement increases the CCW reservoir number, as a result of which the difference between the two remains unaffected.

The robustness of a system vis-à-vis vibrations can be increased by using a plurality of reservoirs with their injectors at different positions, such that reservoir 1 increments at the angular positions 0°, 180°, while reservoir 2 increments at 45°, 225°. If a vibration occurs at 0°, it may be the case that reservoir 1 overflows, while reservoir 2 still works.

Another embodiment uses a specific conical geometry of the injector from FIG. 6: by adjusting the angle of the wedge of the injector, it is possible to set a particular hysteresis window of angular positions of the applied magnetic field of the permanent magnet within which no further skyrmions are injected into the reservoir.

Figure 10:
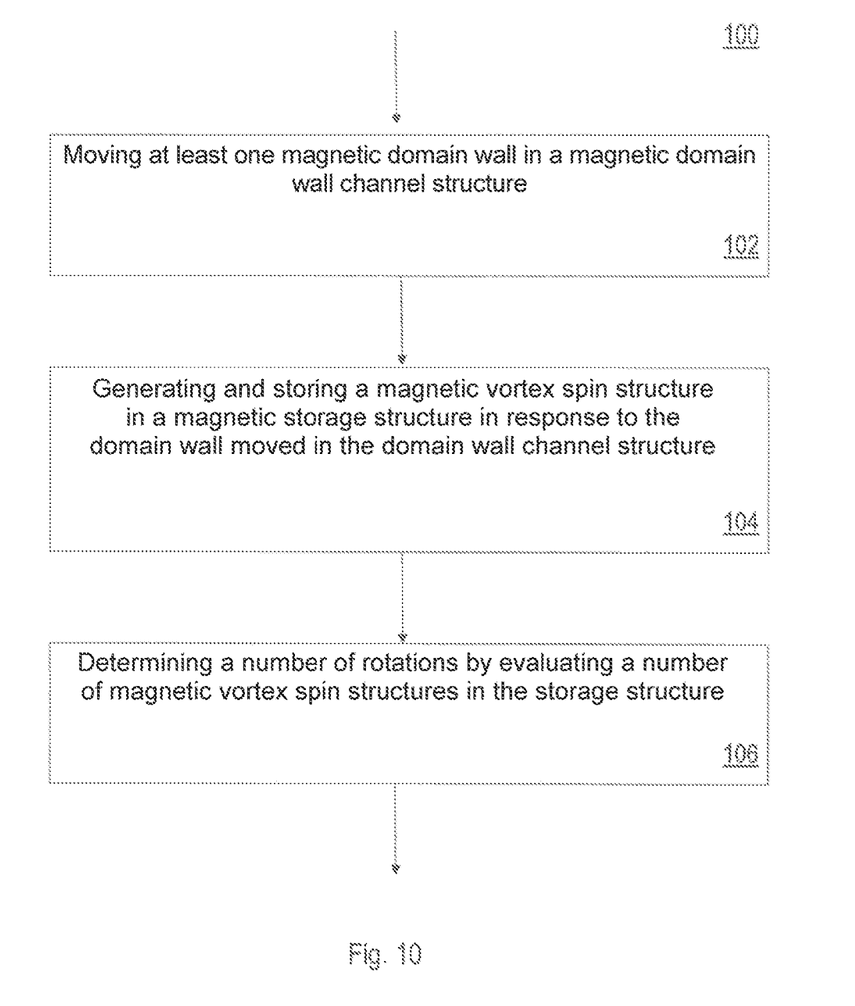
FIG. 10 shows a method for generating skyrmions in accordance with one exemplary embodiment of the present disclosure.

In summary, FIG. 10 illustrates a method 100 for measuring a number of rotations of a magnetic field which is rotating in a reference system.

The method 100 comprises a step 102 of moving, by means of the rotating magnetic field, a magnetic domain wall 22 in a ferromagnetic domain wall channel structure 20. The method 100 comprises a step 104 of nucleating, in response to the domain wall 22 moved in the domain wall channel structure 20, at least one magnetic vortex spin structure (e.g., a skyrmion) 10 in a magnetic storage structure 38. The method 100 furthermore comprises an optional step 106 of determining a number of rotations by evaluating a number of magnetic vortex spin structures (skyrmions) in the storage structure 38.

The aspects and features that have been described in association with a specific one of the examples above can also be combined with one or more of the further examples in order to replace an identical or similar feature of this further example or in order additionally to introduce the feature into the further example.

Examples can furthermore be or relate to a (computer) program comprising a program code for carrying out one or more of the above methods when the program is executed on a computer, a processor or some other programmable hardware component. Steps, operations, or processes of various methods from among those described above can thus also be performed by programmed computers, processors, or other programmable hardware components. Examples can also cover program storage devices, e.g., digital data storage media, which are machine-, processor- or computer-readable and code or contain machine-executable, processor-executable or computer-executable programs and instructions. The program storage devices can comprise or be e.g., digital memories, magnetic storage media such as, for example, magnetic disks and magnetic tapes, hard disk drives or optically readable digital data storage media. Further examples can also cover computers, processors, control units, (field) programmable logic arrays ((F)PLAs), (field) programmable gate arrays ((F)PGAs), graphics processor units (GPUs=Graphics Processor Unit), application-specific integrated circuits (ASICs), integrated circuits (ICs) or systems-on-a-chip (SoCs) which are programmed to carry out the steps of the methods described above.

It furthermore goes without saying that the disclosure of a plurality of steps, processes, operations or functions disclosed in the description or the claims should not be interpreted as being mandatorily in the order described, unless this is explicitly indicated or absolutely necessary for technical reasons in an individual case. Therefore, the preceding description does not limit the implementation of a plurality of steps or functions to a specific order. Furthermore, in further examples, an individual step, an individual function, an individual process or an individual operation can include a plurality of partial steps, partial functions, partial processes or partial operations and/or be subdivided into them.

Where some aspects in the preceding sections have been described in association with an apparatus or a system, these aspects should also be understood as a description of the corresponding method. In this case, for example, a block, an apparatus or a functional aspect of the apparatus or of the system can correspond to a feature, for instance a method step, of the corresponding method. Analogously thereto, aspects described in association with a method should also be understood as a description of a corresponding block, a corresponding element, a property or a functional feature of a corresponding apparatus or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

What is claimed is:

1. An apparatus for generating magnetic vortex spin structures, comprising:
   a magnetic domain wall channel structure having at least one magnetic domain wall configured to move in response to a rotating external magnetic field, wherein the magnetic domain wall channel structure is spiral; and
   a magnetic injection structure, facing the magnetic domain wall channel structure and arranged at one end of the magnetic domain wall channel structure, configured to:
   generate at least one magnetic vortex spin structure, in response to the at least one magnetic domain wall being moved in the magnetic domain wall channel structure past the magnetic injection structure, and
   provide the at least one magnetic vortex spin structure to a magnetic reservoir structure,
   wherein the magnetic injection structure extends outwardly from the magnetic reservoir structure, and
   wherein the magnetic injection structure is arranged at one end of the magnetic domain wall channel structure and is between the magnetic reservoir structure and the magnetic domain wall channel structure.

2. The apparatus as claimed in claim 1, wherein one section of the magnetic domain wall channel structure is curved and another section of the magnetic domain wall channel structure is straight.

3. The apparatus as claimed in claim 1, wherein the magnetic domain wall channel structure comprises a ferromagnetic or ferrimagnetic material.

4. The apparatus as claimed in claim 1, wherein the magnetic injection structure and the magnetic reservoir structure are configured in integral, monolithic fashion.

5. The apparatus as claimed in claim 1, wherein the magnetic injection structure is positioned in a vicinity of the magnetic domain wall channel structure such that, in the magnetic injection structure, the at least one magnetic vortex spin structure is nucleated in response to a magnetic stray field of the at least one magnetic domain wall being moved in the magnetic domain wall channel structure.

6. The apparatus as claimed in claim 1, wherein the magnetic injection structure is a first magnetic injection structure and the magnetic reservoir structure is a first magnetic reservoir structure, wherein the first magnetic injection structure and the first magnetic reservoir structure are arranged on one turn of the magnetic domain wall channel structure,
   the apparatus further comprising a second magnetic injection structure and a second reservoir structure that are arranged on a different turn of the magnetic domain wall channel structure.

7. The apparatus as claimed in claim 1, wherein the magnetic injection structure has a geometry dependent on a domain wall movement direction to be detected.

8. The apparatus as claimed in claim 1, further comprising a rotatable object configured to generate a magnetic field which rotates relative to the magnetic domain wall channel structure and move the at least one magnetic domain wall in the magnetic domain wall channel structure.

9. The apparatus as claimed in claim 8, wherein the magnetic field which rotates relative to the domain wall channel structure has magnetic field components in a principal plane of extent of the domain wall channel structure.

10. The apparatus as claimed in claim 1, wherein the magnetic injection structure and the magnetic reservoir structure each have a stack structure composed of a heavy metal, a magnetic material, and an insulating material.

11. The apparatus as claimed in claim 10, wherein the magnetic material of the injection structure or of the magnetic reservoir structure is configured as an ultrathin magnetic film and has a preferred magnetization direction perpendicular to a layer plane of the stack structure.

12. The apparatus as claimed in claim 1, further comprising:
    an evaluation device configured to determine a number of stored magnetic vortex spin structures, including at least one magnetic vortex spin structure, in the magnetic reservoir structure.

13. The apparatus as claimed in claim 12, wherein the magnetic reservoir structure is a first magnetic reservoir structure,
    wherein the evaluation device comprises the first magnetic reservoir structure, a second magnetic reservoir structure coupled to the first magnetic reservoir structure, and at least one magnetic sensor, and
    wherein the evaluation device is further configured to transport the at least one magnetic vortex spin structure from the first magnetic reservoir structure to the second magnetic reservoir structure by means of electric current flow and sense transported magnetic vortex spin structures by means of the at least one magnetic sensor.

14. The apparatus as claimed in claim 12, wherein the evaluation device includes a magnetic sensor in order to determine the number of stored magnetic vortex spin structures.

15. The apparatus as claimed in claim 12, wherein the evaluation device includes a magnetic sensor and is configured to transport the at least one magnetic vortex spin structure from the magnetic reservoir structure and sense the at least one magnetic vortex spin structure transported from the magnetic reservoir structure by means of the magnetic sensor.

16. The apparatus as claimed in claim 15, wherein the evaluation device is configured to transport the stored magnetic vortex spin structures from the magnetic reservoir structure by injection of an electric current.

17. An apparatus for generating magnetic vortex spin structures, comprising:
    a first magnetic domain wall channel structure having at least one first magnetic domain wall configured to move in a clockwise direction in the first magnetic domain wall channel structure;
a first magnetic injection structure, facing the first magnetic domain wall channel structure, configured to generate at least one first magnetic vortex spin structure, in response to the at least one first magnetic domain wall being moved in the first magnetic domain wall channel structure past the first magnetic injection structure, and provide the at least one first magnetic vortex spin structure to a first magnetic reservoir structure,
wherein the first magnetic injection structure extends outwardly from the first magnetic reservoir structure and is between the first magnetic reservoir structure and the first magnetic domain wall channel structure;
a second magnetic domain wall channel structure having at least one second magnetic domain wall configured to move in a counterclockwise direction in the second magnetic domain wall channel structure; and
a second magnetic injection structure, facing the second magnetic domain wall channel structure, configured to generate at least one second magnetic vortex spin structure, in response to the at least one second magnetic domain wall being moved in the second magnetic domain wall channel structure past the second magnetic injection structure, and provide the at least one second magnetic vortex spin structure to a second magnetic reservoir structure,
wherein the second magnetic injection structure extends outwardly from the second magnetic reservoir structure and is between the second magnetic reservoir structure and the second magnetic domain wall channel structure.

18. The apparatus as claimed in claim 17, further comprising:
an evaluation device configured to determine a number of generated first magnetic vortex spin structures, including the at least one first magnetic vortex spin structure, in the first magnetic reservoir structure and a number of generated second magnetic vortex spin structures, including the at least one second magnetic vortex spin structure, in the second magnetic reservoir structure.

19. The apparatus as claimed in claim 18, wherein the evaluation device comprises a Wheatstone bridge circuit having first resistors proportional to the number of generated first magnetic vortex spin structures and having second resistors proportional to the number of generated second magnetic vortex spin structures.

20. A method for generating magnetic vortex spin structures, the method comprising:
generating, by a magnetic injection structure facing a magnetic domain wall channel structure, at least one magnetic vortex spin structure in response to at least one magnetic domain wall being moved in the magnetic domain wall channel structure past the magnetic injection structure, wherein the magnetic domain wall channel structure is spiral; and
providing, by the magnetic injection structure, the at least one magnetic vortex spin structure to a magnetic reservoir structure,
wherein the magnetic injection structure extends outwardly from the magnetic reservoir structure, and wherein the magnetic injection structure is arranged at one end of the magnetic domain wall channel structure and is between the magnetic reservoir structure and the magnetic domain wall channel structure.

21. An apparatus for measuring a number of rotations of a magnetic field which is rotating in a reference system, comprising:
a ferromagnetic domain wall channel structure, in which a magnetic domain wall is movable by the rotating of the magnetic field, wherein the ferromagnetic domain wall channel structure is spiral;
a magnetic storage structure comprising:
an injection structure, facing the ferromagnetic domain wall channel structure and arranged at one end of the ferromagnetic domain wall channel structure, configured to nucleate at least one magnetic vortex spin structure in the magnetic storage structure in response to the magnetic domain wall being moved in the ferromagnetic domain wall channel structure past the injection structure, and
a reservoir, connected to the injection structure, configured to store the at least one magnetic vortex spin structure,
wherein the injection structure extends outwardly from the reservoir and is between the reservoir and the ferromagnetic domain wall channel structure; and
an evaluation device configured to determine the number of rotations by evaluating a number of magnetic vortex spin structures, including the at least one magnetic vortex spin structure, in the magnetic storage structure.

22. The apparatus as claimed in claim 21, further comprising a rotatable object configured to generate a magnetic field which rotates relative to the ferromagnetic domain wall channel structure, and move the magnetic domain wall in the ferromagnetic domain wall channel structure.

23. The apparatus as claimed in claim 22, wherein the magnetic field which rotates relative to the domain wall channel structure has magnetic field components in a principal plane of extent of the domain wall channel structure.

24. A method for measuring a number of rotations of a magnetic field which is rotating in a reference system, the method comprising:
moving, by the rotating of the magnetic field, a magnetic domain wall in a ferromagnetic domain wall channel structure, wherein the ferromagnetic domain wall channel structure is spiral;
nucleating, by a magnetic vortex spin structure injector and in response to the magnetic domain wall being moved in the ferromagnetic domain wall channel structure past the magnetic vortex spin structure injector, at least one magnetic vortex spin structure in a magnetic storage structure, wherein the magnetic vortex spin structure injector extends outwardly from the magnetic storage structure and is between the magnetic storage structure and the ferromagnetic domain wall channel structure, wherein the magnetic vortex spin structure injector is arranged at one end of the ferromagnetic domain wall channel structure; and
determining the number of rotations by evaluating a number of magnetic vortex spin structures in the magnetic storage structure.

* * * * *